US008927368B2

(12) United States Patent
Saitoh et al.

(10) Patent No.: US 8,927,368 B2
(45) Date of Patent: Jan. 6, 2015

(54) METHOD FOR MANUFACTURING SILICON CARBIDE SEMICONDUCTOR DEVICE

(71) Applicant: Sumitomo Electric Industries, Ltd., Osaka (JP)

(72) Inventors: Yu Saitoh, Osaka (JP); Takeyoshi Masuda, Osaka (JP); Hideki Hayashi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/958,151

(22) Filed: Aug. 2, 2013

(65) Prior Publication Data

US 2014/0073101 A1    Mar. 13, 2014

Related U.S. Application Data

(60) Provisional application No. 61/700,078, filed on Sep. 12, 2012.

(30) Foreign Application Priority Data

Sep. 12, 2012   (JP) .................. 2012-200180

(51) Int. Cl.
*H01L 21/336* (2006.01)
*H01L 21/3205* (2006.01)
*H01L 21/4763* (2006.01)
*H01L 29/66* (2006.01)

(52) U.S. Cl.
CPC ....... *H01L 29/66666* (2013.01); *Y10S 438/931* (2013.01)
USPC ........... 438/270; 438/589; 438/259; 438/931; 257/330

(58) Field of Classification Search
CPC .............. H01L 29/7813; H01L 29/42368; H01L 29/407; H01L 29/66734; H01L 29/4236; H01L 29/1608
USPC ......... 438/138, 197, 212, 268, 270, 589, 931; 257/329, 330, 440
See application file for complete search history.

(56) References Cited

U.S. PATENT DOCUMENTS 5,637,898 A * 6/1997 Baliga ........................... 257/330
5,744,826 A * 4/1998 Takeuchi et al. ............... 257/77
(Continued)

FOREIGN PATENT DOCUMENTS

JP      07-326755 A    12/1995
JP      2006-203007 A   8/2006
(Continued)

OTHER PUBLICATIONS

Jansen, H. et al. "A survey on the reactive ion etching of silicon in microtechnology", J. Micromech. Microeng. 6 (1996) pp. 14-28.*

(Continued)

*Primary Examiner* — Mary Wilczewski
*Assistant Examiner* — Erik T Peterson
(74) *Attorney, Agent, or Firm* — Venable LLP; Michael A. Sartori; F. Brock Riggs

(57) ABSTRACT

A trench having a side wall and a bottom portion is formed in a silicon carbide substrate. A trench insulating film is formed to cover the bottom portion and the side wall. A silicon film is formed to fill the trench with the trench insulating film being interposed therebetween. The silicon film is etched so as to leave a portion of the silicon film that is disposed on the bottom portion with the trench insulating film being interposed therebetween. The trench insulating film is removed from the side wall. By oxidizing the silicon film, a bottom insulating film is formed. A side wall insulating film is formed on the side wall.

12 Claims, 14 Drawing Sheets

(56) References Cited

U.S. PATENT DOCUMENTS

| | | | |
|---|---|---|---|
| 5,915,180 A | | 6/1999 | Hara et al. |
| 5,976,936 A | * | 11/1999 | Miyajima et al. ............ 438/268 |
| 5,998,833 A | * | 12/1999 | Baliga .......................... 257/329 |
| 7,005,351 B2 | * | 2/2006 | Henninger et al. ........... 438/268 |
| 7,648,877 B2 | * | 1/2010 | Andrews ....................... 438/270 |
| 2004/0180510 A1 | | 9/2004 | Ranade et al. |
| 2006/0014349 A1 | | 1/2006 | Williams et al. |
| 2006/0166419 A1 | | 7/2006 | Shimoyama et al. |
| 2007/0037327 A1 | | 2/2007 | Herrick et al. |
| 2007/0187695 A1 | * | 8/2007 | Nakamura et al. ............. 257/77 |
| 2008/0150015 A1 | * | 6/2008 | Cho .............................. 257/330 |
| 2009/0078995 A1 | | 3/2009 | Nakagawa et al. |
| 2009/0321817 A1 | * | 12/2009 | Hunt ............................. 257/330 |
| 2010/0019250 A1 | * | 1/2010 | Nakamura et al. ............. 257/77 |
| 2010/0184095 A1 | * | 7/2010 | Haketa et al. ................ 435/7.21 |
| 2010/0193799 A1 | | 8/2010 | Nakano et al. |
| 2010/0314626 A1 | | 12/2010 | Harada et al. |
| 2010/0320534 A1 | * | 12/2010 | Pan et al. ..................... 257/334 |
| 2011/0068353 A1 | | 3/2011 | Nakano |
| 2011/0136309 A1 | * | 6/2011 | Grivna et al. ................. 438/270 |
| 2011/0136310 A1 | * | 6/2011 | Grivna .......................... 438/270 |
| 2012/0025304 A1 | * | 2/2012 | Blank et al. ................... 257/331 |
| 2012/0049202 A1 | * | 3/2012 | Nakano .......................... 257/77 |
| 2012/0228640 A1 | | 9/2012 | Masuda et al. |

FOREIGN PATENT DOCUMENTS

| | | |
|---|---|---|
| JP | 2009-224365 A | 10/2009 |
| JP | 2010-263104 A | 11/2010 |
| WO | WO-2009/142233 A1 | 11/2009 |
| WO | WO-2012/098861 A1 | 7/2012 |
| WO | WO-2012/105170 A1 | 8/2012 |

OTHER PUBLICATIONS

Song, Y., et al. "Modified Deal Grove model for the thermal oxidation of silicon carbide", J. Appl. Phys. 95, (2004) pp. 4953-4957.*
T. Nakamura et al., "High Performance SiC Trench Devices with Ultra-low Ron," IEEE Electron Devices Meeting (IEDM), 2011, pp. 26.5.1-26.5.3.
Masuda et al., U.S. Appl. No. 13/958,073, filed Aug. 2, 2013.
Hayashi et al., U.S. Appl. No. 13/958,115, filed Aug. 2, 2013.
International Search Report and Written Opinion in PCT International Application No. PCT/JP2013/070575, dated Nov. 5, 2013.
International Search Report and Written Opinion in PCT International Application No. PCT/JP2013/068399, dated Oct. 8, 2013.
International Search Report and Written Opinion in PCT International Application No. PCT/JP2013/068400, dated Oct. 8, 2013.
Vathulya et al., "On the correlation between the carbon content and the electrical quality of thermally grown oxides on p-type 6H-silicon carbide," Applied Physics Letters, vol. 73, pp. 2161-2163, (1998).
Office Action in U.S. Appl. No. 13/958,073, dated May 6, 2014.
Office Action in U.S. Appl. No. 13/958,115, dated May 9, 2014.

* cited by examiner

METHOD FOR MANUFACTURING SILICON CARBIDE SEMICONDUCTOR DEVICE

BACKGROUND OF THE INVENTION

1. Field of the Invention

The present invention relates to a method for manufacturing a silicon carbide semiconductor device, in particular, a method for manufacturing a silicon carbide semiconductor device having a trench.

2. Description of the Background Art

Japanese Patent Laying-Open No. 7-326755 discloses a silicon carbide semiconductor device having a trench. This patent publication describes that a gate thermal oxidation film has a thicker film thickness on a bottom surface of the trench than that on a side surface of the trench, thereby achieving a low threshold voltage and a high breakdown voltage between the gate and the drain. Also described therein is as follows. That is, the bottom surface of the trench corresponds to a carbon plane of hexagonal single-crystal silicon carbide. The carbon plane allows for fast oxidation rate. The side surface of the trench corresponds to a plane perpendicular to this carbon plane and allowing for slow oxidation rate. Accordingly, by performing a thermal oxidation step once, a thermal oxidation film can be formed such that the thickness thereof on the side surface of the trench is greatly different from the thickness thereof on the bottom surface of the trench.

In a method that employs crystal orientation dependence of thermal oxidation rate such as the technique described in the above-described patent publication, there is a limit in increasing the thickness of the gate insulating film on the bottom portion of the trench as compared with the thickness thereof on the side wall of the trench. In addition, the crystal orientation dependence of the thermal oxidation rate becomes small unless a thermal oxidation temperature lower than that in a normal case is employed. For this reason, with this method, low threshold voltage and large breakdown voltage are less likely to be sufficiently attained at the same time.

SUMMARY OF THE INVENTION

The present invention has been made to solve the foregoing problem, and has its object to provide a method for manufacturing a silicon carbide semiconductor device having a low threshold voltage, a large breakdown voltage, and high reliability.

A method for manufacturing a silicon carbide semiconductor device in the present invention includes the following steps. There is prepared a silicon carbide substrate including a first layer that has first conductivity type, a second layer that is provided on the first layer and that has second conductivity type, and a third layer that is provided on the second layer, that is separated from the first layer by the second layer, and that has the first conductivity type. A trench is formed in the silicon carbide substrate, the trench having a side wall and a bottom portion, the side wall extending through the third layer and the second layer and reaching the first layer, the bottom portion being formed of the first layer. A trench insulating film is formed to cover each of the bottom portion and the side wall. A silicon film is formed to fill the trench with the trench insulating film being interposed therebetween. The silicon film is partially etched so as to expose a portion of the trench insulating film that covers the second layer on the side wall and so as to leave a portion of the silicon film that is disposed on the bottom portion with the trench insulating film being interposed therebetween. The second layer is exposed on the side wall by removing the portion of the trench insulating film that covers the second layer on the side wall, after partially etching the silicon film. A bottom insulating film is formed by oxidizing the silicon film, after exposing the second layer. A side wall insulating film is formed to cover the second layer on the side wall, after exposing the second layer. A gate electrode is formed on the side wall with the side wall insulating film being interposed therebetween.

According to this manufacturing method, electric insulation between the gate electrode and the bottom portion of the trench is improved by the bottom insulating film. Accordingly, the silicon carbide semiconductor device has a large breakdown voltage without increasing the threshold voltage. Further, according to this manufacturing method, the side wall insulating film that covers the second layer on the side wall, i.e., the portion of the gate insulating film that covers the channel surface is formed after the etching of the silicon film. Hence, the portion of the gate insulating film that covers the channel surface is not damaged by the etching. In this way, reliability of the silicon carbide semiconductor device is improved. As described above, there can be obtained a silicon carbide semiconductor device having a low threshold voltage, a large breakdown voltage, and high reliability.

Preferably, the side wall insulating film is formed by thermal oxidation. Accordingly, a thin and highly smooth side wall insulating film can be obtained. In this way, reliability of the silicon carbide semiconductor device is further improved.

Preferably, the trench insulating film is formed by thermal oxidation. Hence, the trench insulating film can be readily formed.

Preferably, during the partial etching of the silicon film, etching having a physical etching effect is performed. The side wall insulating film, which is to be formed after this etching, is not damaged by the physical etching. In this way, reliability of the silicon carbide semiconductor device is greatly improved.

Preferably, the silicon film is flattened before partially etching the silicon film. Accordingly, during the partial etching of the silicon film, the portion of the trench insulating film that covers the second layer on the side wall is readily exposed and the portion of the silicon film that is disposed on the bottom portion with the trench insulating film being interposed therebetween is readily left.

Preferably, when forming the bottom insulating film, the silicon film is completely oxidized by thermally oxidizing silicon at not less than 900° C. and not more than 1100° C. With the temperature of not less than 900° C., the thermal oxidation can be performed at a practical rate. With the temperature of not more than 1100° C., SiO gas can be suppressed from being generated due to reaction between Si in the silicon film and $SiO_2$ in the trench insulating film. Accordingly, contamination by $SiO_2$ particles, which are otherwise generated due to oxidation of the SiO gas, can be suppressed.

Preferably, when forming the side wall insulating film, the silicon carbide substrate is heated so as to thermally oxidize the silicon carbide substrate. Oxygen is supplied to the silicon carbide substrate while increasing a temperature of the silicon carbide substrate during the heating of the silicon carbide substrate. Accordingly, SiO gas can be suppressed from being generated due to reaction between Si in the silicon film and $SiO_2$ in the trench insulating film. Accordingly, contamination by $SiO_2$ particles, which are otherwise generated due to oxidation of the SiO gas, can be suppressed.

Preferably, when partially etching the silicon film, dry etching is performed using a gas containing sulfur hexafluoride. Accordingly, the silicon film can be etched while suppressing the trench insulating film from being etched.

Preferably, the silicon film is partially etched to provide the silicon film with a thickness of less than 300 nm. Accordingly, a whole of the silicon film can be readily oxidized in the formation of the bottom insulating film.

As described above, according to the present invention, a low threshold voltage, a large breakdown voltage, and high reliability are attained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
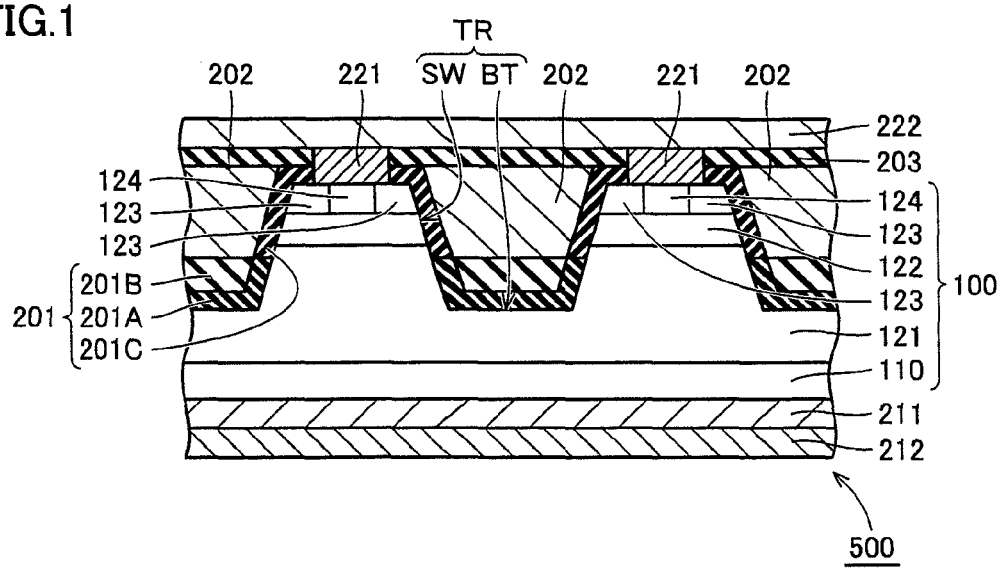
FIG. 1 is a partial cross sectional view schematically showing a configuration of a silicon carbide semiconductor device in a first embodiment of the present invention.

The following describes an embodiment of the present invention based on figures. It should be noted that in the below-mentioned figures, the same or corresponding portions are given the same reference characters and are not described repeatedly. Regarding crystallographic indications in the present specification, an individual orientation is represented by [ ], a group orientation is represented by < >, and an individual plane is represented by ( ), and a group plane is represented by { }. In addition, a negative crystallographic index is normally expressed by putting "-" (bar) above a numeral, but is expressed by putting the negative sign before the numeral in the present specification.

First Embodiment

As shown in FIG. 1, a vertical type MOSFET 500 (silicon carbide semiconductor device) of the present embodiment includes an epitaxial substrate 100 (silicon carbide substrate), gate insulating films 201, gate electrodes 202, interlayer insulating films 203, source electrodes 221, a drain electrode 211, a source interconnection 222, and a protecting electrode 212.

Epitaxial substrate 100 is made of silicon carbide, and has a single-crystal substrate 110 and an epitaxial layer provided thereon. The epitaxial layer includes an n⁻ layer 121 (first layer), p type body layers 122 (second layer), n regions 123 (third layer), and contact regions 124. The silicon carbide of epitaxial substrate 100 preferably has a hexagonal crystal structure, more preferably, has polytype of 4H.

Single-crystal substrate 110 has n type conductivity (first conductivity type). The plane orientation (hklm) of one main surface (upper surface in FIG. 1) of single-crystal substrate 110 preferably has m of negative value, more preferably, is approximately a (000-1) plane.

N⁻ layer 121 has a donor added therein, and therefore has n type conductivity. The donor is preferably added to n⁻ layer 121 by adding an impurity during epitaxial growth of n⁻ layer 121, rather than ion implantation. N⁻ layer 121 preferably has a donor concentration lower than that of single-crystal substrate 110. The donor concentration of n⁻ layer 121 is preferably not less than $1\times10^{15}$ cm$^{-3}$ and not more than $5\times10^{16}$ cm$^{-3}$, for example, is $8\times10^{15}$ cm$^{-3}$.

Each of p type body layers 122 is provided on n⁻ layer 121, has an acceptor added therein, and therefore has p type conductivity (second conductivity type). P type body layer 122 has an acceptor concentration of, for example, $1\times10^{18}$ cm$^{-3}$.

Each of n regions 123 has n type conductivity. N region 123 is provided on p type body layer 122, and is separated from n⁻ layer 121 by p type body layer 122. Each of contact regions 124 has p type conductivity. Contact region 124 is formed on a portion of p type body layer 122 so as to be connected to p type body layer 122.

Figure 2:
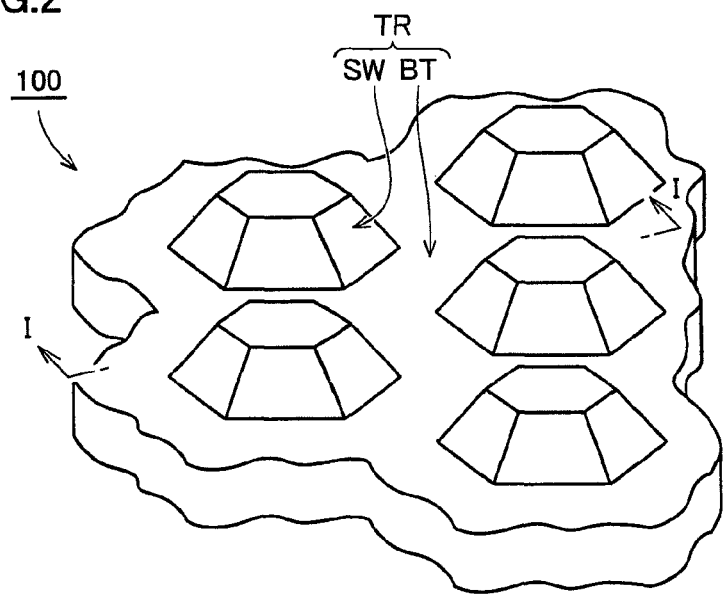
FIG. 2 is a perspective view schematically showing a shape of a silicon carbide substrate included in the silicon carbide semiconductor device of FIG. 1.
Figure 3:
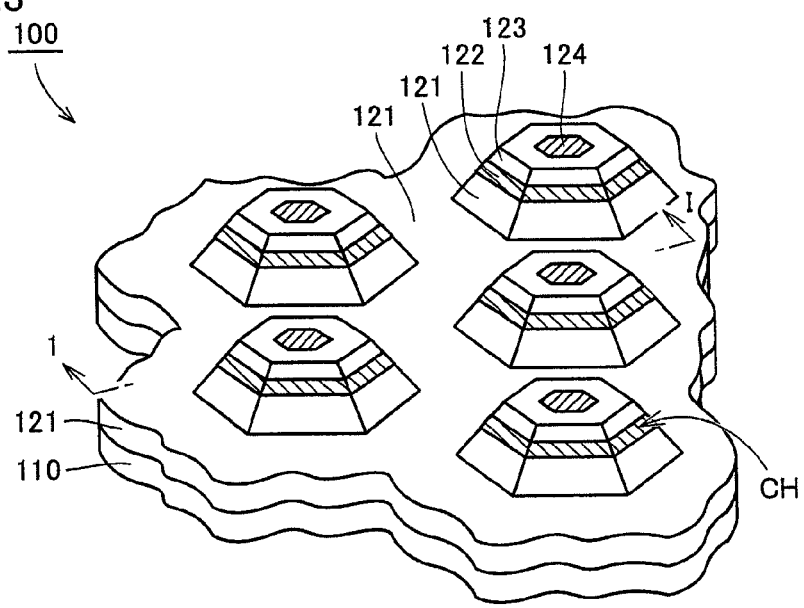
FIG. 3 shows the configuration of FIG. 2 more in detail, with a region of second conductivity type being provided with hatching for viewability of the figure.

Referring to FIG. 2 and FIG. 3, epitaxial substrate 100 is provided with a trench TR. Trench TR has side walls SW and a bottom portion BT. Each of side walls SW extends through n region 123 and p type body layer 122 and reaches n⁻ layer 121. Bottom portion BT is formed of n⁻ layer 121. Each of side walls SW has a channel surface CH (FIG. 3) on p type body layer 122. Bottom portion BT is a flat surface substantially parallel to the main surface of epitaxial substrate 100. Preferably, side wall SW has a predetermined crystal plane (also referred to as "special plane") particularly on p type body layer 122. Details of the special plane will be described later.

The fact that epitaxial substrate 100 has trench TR corresponds to such a fact that the epitaxial layer is partially removed above the upper surface of single-crystal substrate 110. In the present embodiment, a multiplicity of mesa structures are formed on the upper surface of single-crystal substrate 110. Specifically, each of the mesa structures has upper surface and bottom surface both having a hexagonal shape, and has side walls inclined relative to the upper surface of single-crystal substrate 110. Accordingly, trench TR is expanded toward the opening side in a tapered manner.

Gate insulating film 201 is provided on trench TR. Gate insulating film 201 separates epitaxial substrate 100 and gate electrode 202 from each other in trench TR. Gate insulating film 201 has a trench insulating film 201A, a bottom insulating film 201B, and a side wall insulating film 201C. Trench insulating film 201A covers side wall SW at its portion connected to bottom portion BT and covers bottom portion BT. Bottom insulating film 201B is provided on bottom portion BT with trench insulating film 201A being interposed therebetween. Bottom insulating film 201B has a portion located at an angular portion formed by bottom portion BT and side wall SW. Side wall insulating film 201C covers side wall SW between the opening of trench TR and trench insulating film 201A. On side wall SW, p type body layer 122 is covered with side wall insulating film 201C.

Each of trench insulating film 201A and side wall insulating film 201C is a thermal oxidation film of silicon carbide. Each of trench insulating film 201A and side wall insulating film 201C is made of silicon oxide containing carbon atoms as an impurity. Bottom insulating film 201B is a thermal oxidation film of silicon film, and is made of silicon oxide. Hence, bottom insulating film 201B has a carbon atom concentration lower than that of each of trench insulating film 201A and side wall insulating film 201C.

Figure 4:
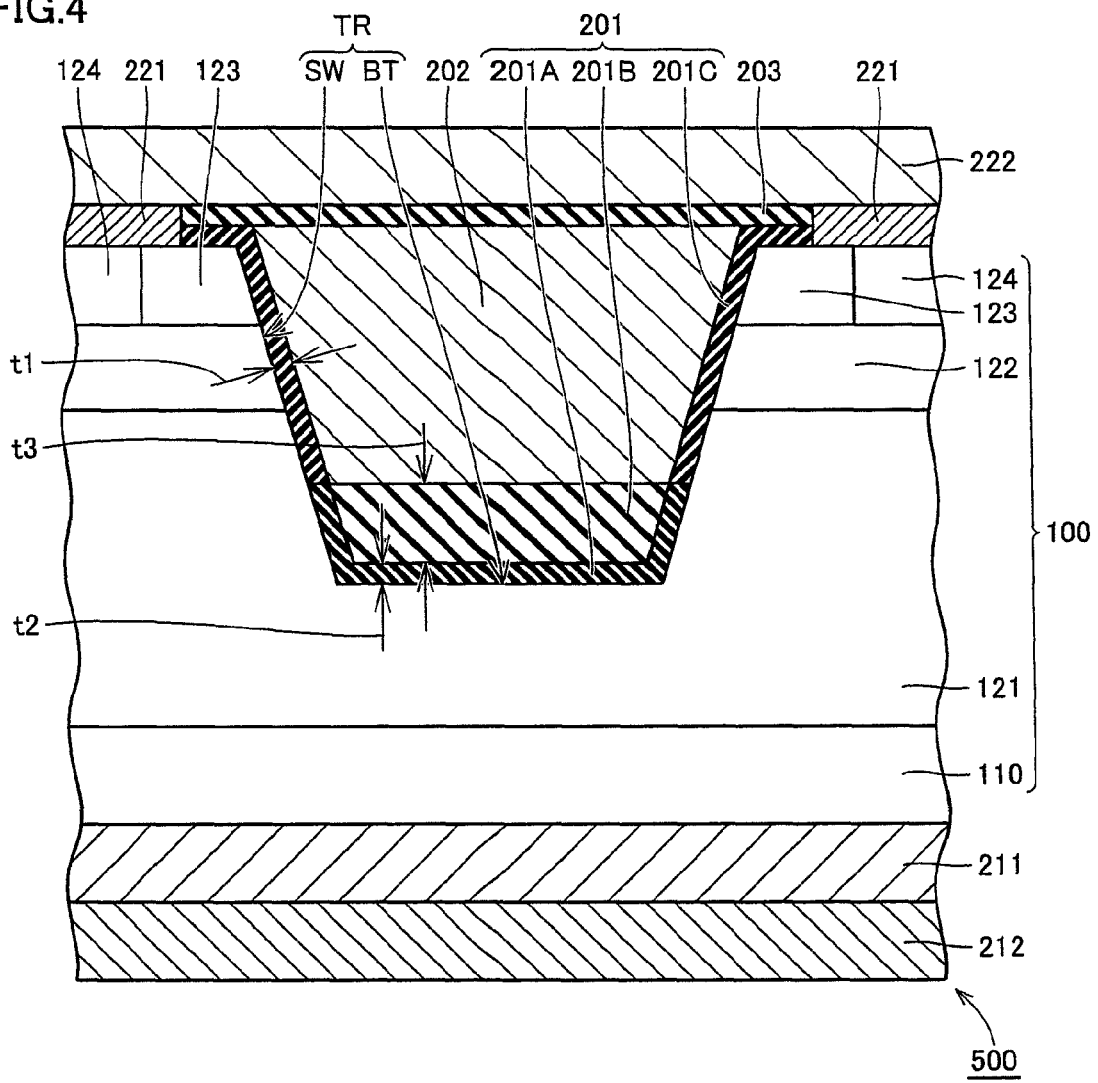
FIG. 4 is an enlarged view of FIG. 1.

As shown in FIG. 4, side wall insulating film 201C has a thickness t1 on side wall SW. Trench insulating film 201A has a thickness t2 on bottom portion BT. Bottom insulating film 201B has a thickness t3 on bottom portion BT. A total of thickness t2 and thickness t3 is preferably larger than thickness t1. Thickness t3 is preferably larger than thickness t2. Thickness t2 is preferably smaller than thickness t1. Thickness t3 is preferably larger than 100 nm.

Each of trench insulating film 201A and side wall insulating film 201C may have a carbon atom concentration of more than $1\times10^{15}$ cm$^{-3}$. Bottom insulating film 201B preferably has a carbon atom concentration of less than $1\times10^{15}$ cm$^{-3}$. It should be noted that when the carbon atom concentration is not uniform, an average value may be calculated. The carbon atom concentration of trench insulating film 201A on bottom portion BT is typically larger than approximately $1\times10^{17}$ cm$^{-3}$ and is smaller than approximately $1\times10^{20}$ cm$^{-3}$, for example, is approximately $1\times10^{18}$ cm$^{-3}$.

Gate electrode 202 is provided in trench TR. Specifically, gate electrode 202 is filled in trench TR with gate insulating film 201 being interposed therebetween. Gate electrode 202 is in contact with side wall insulating film 201C. More specifically, gate electrode 202 is provided on side wall SW with only side wall insulating film 201C being interposed therebetween, so as to face the surface of p type body layer 122. In other words, bottom insulating film 201B is not provided between side wall insulating film 201C and gate electrode 202. Gate electrode 202 has an upper surface substantially as high as the upper surface of a portion of gate insulating film 201 on the upper surface of n region 123. Interlayer insulating film 203 is provided to cover gate electrode 202 as well as the extended portion of gate insulating film 201 on the upper surface of n region 123.

Source electrode 221 extends through interlayer insulating film 203 and is in contact with each of n region 123 and contact region 124. Source interconnection 222 is provided on source electrode 221 and interlayer insulating film 203 in contact with source electrode 221. Drain electrode 211 is provided on an opposite surface of epitaxial substrate 100 to its surface provided with trench TR. Protecting electrode 212 covers drain electrode 211.

The following describes a method for manufacturing MOSFET 500 (FIG. 1).

Figure 5:
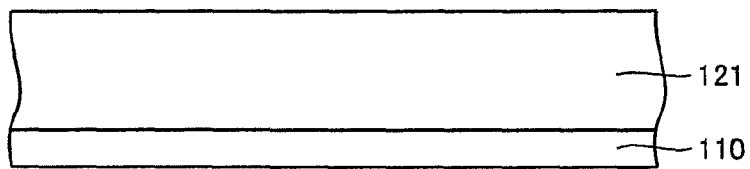
FIG. 5 is a partial cross sectional view schematically showing a first step of a method for manufacturing the silicon carbide semiconductor device of FIG. 1.

As shown in FIG. 5, on single-crystal substrate 110, n⁻ layer 121 is formed by means of epitaxial growth. This epitaxial growth can be achieved by employing a CVD (Chemical Vapor Deposition) method that utilizes a mixed gas of silane (SiH₄) and propane (C₃H₈) as a material gas and utilizes hydrogen gas (H₂) as a carrier gas, for example. In doing so, it is preferable to introduce nitrogen (N) or phosphorus (P) as a donor, for example.

Figure 6:
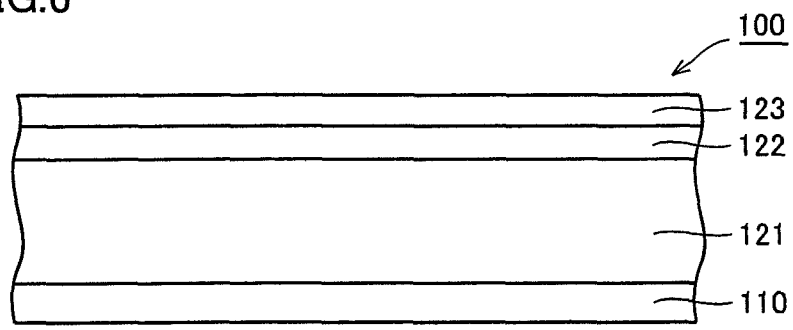
FIG. 6 is a partial cross sectional view schematically showing a second step of the method for manufacturing the silicon carbide semiconductor device of FIG. 1.

As shown in FIG. 6, p type body layer 122 is formed on n⁻ layer 121, and n region 123 is formed on p type body layer 122. Specifically, ions are implanted into the upper surface of n⁻ layer 121. In the ion implantation for forming p type body layer 122, ions of an acceptor such as aluminum (Al) are implanted. Meanwhile, in the ion implantation for forming n region 123, ions of a donor such as phosphorus (P) are implanted, for example. In this way, epitaxial substrate 100 is prepared which includes n⁻ layer 121, p type body layer 122 provided on n⁻ layer 121, and n region 123 provided on p type body layer 122 and separated from n⁻ layer 121 by p type body layer 122. It should be noted that instead of the ion implantation, epitaxial growth involving addition of an impurity may be employed.

Figure 7:
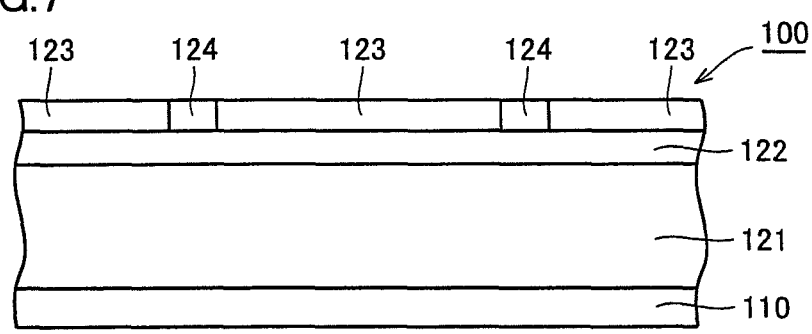
FIG. 7 is a partial cross sectional view schematically showing a third step of the method for manufacturing the silicon carbide semiconductor device of FIG. 1.

As shown in FIG. 7, by means of ion implantation, contact regions 124 are formed. Next, an activation heating process is performed to activate the impurities added by the ion implantation. This heat treatment is preferably performed at a temperature of not less than 1500° C. and not more than 1900° C., for example, a temperature of approximately 1700° C. The heat treatment is performed for approximately 30 minutes, for example. The atmosphere of the heat treatment is preferably an inert gas atmosphere, such as Ar atmosphere.

Figure 8:
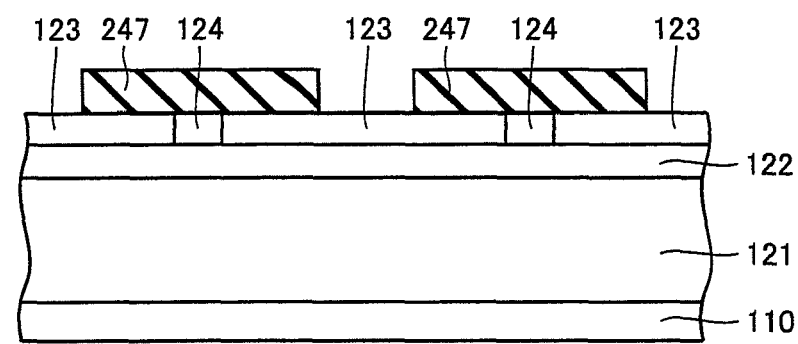
FIG. 8 is a partial cross sectional view schematically showing a fourth step of the method for manufacturing the silicon carbide semiconductor device of FIG. 1.

Next, a mask 247 (FIG. 8) having an opening, through which n region 123 is partially exposed, is formed on epitaxial substrate 100. The opening is formed in conformity with the location of trench TR (FIG. 1). As mask layer 247, a silicon oxide film formed through thermal oxidation can be used, for example.

Figure 9:
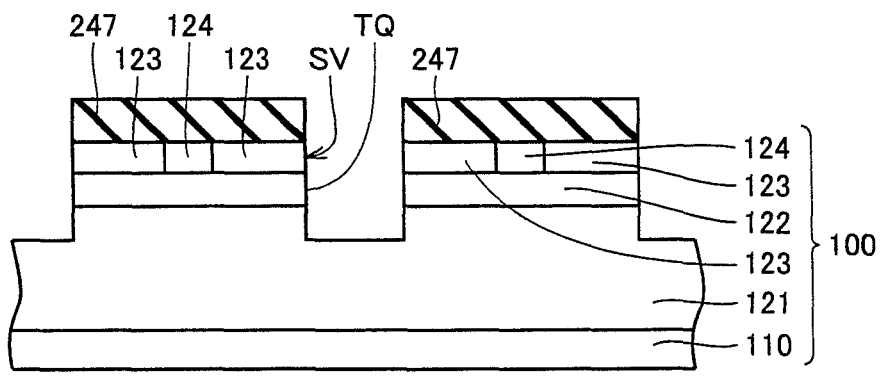
FIG. 9 is a partial cross sectional view schematically showing a fifth step of the method for manufacturing the silicon carbide semiconductor device of FIG. 1.

As shown in FIG. 9, in the opening of mask 247, n region 123, p type body layer 122, and a portion of n⁻ layer 121 are removed by etching. An exemplary, usable etching method is reactive ion etching (RIE), in particular, inductively coupled plasma (ICP) RIE. Specifically, for example, ICP-RIE can be employed which uses $SF_6$ or a mixed gas of $SF_6$ and $O_2$ as the reactive gas. By means of such etching, in the region where trench TR (FIG. 1) is to be formed, a recess TQ can be formed which has a side wall having an inner surface SV substantially perpendicular to the main surface of single-crystal substrate 110.

Next, epitaxial substrate 100 is etched using mask 247. Specifically, thermal etching is performed to epitaxial substrate 100 at inner surface SV of recess TQ. The thermal etching can be performed by, for example, heating epitaxial substrate 100 in an atmosphere containing a reactive gas having at least one or more types of halogen atom. The at least one or more types of halogen atom include at least one of chlorine (Cl) atom and fluorine (F) atom. This atmosphere is, for example, $Cl_2$, $BCL_3$, $SF_6$, or $CF_4$. For example, the thermal etching is performed using a mixed gas of chlorine gas and oxygen gas as a reactive gas, at a heat treatment temperature of, for example, not less than 700° C. and not more than 1000° C.

Figure 10:
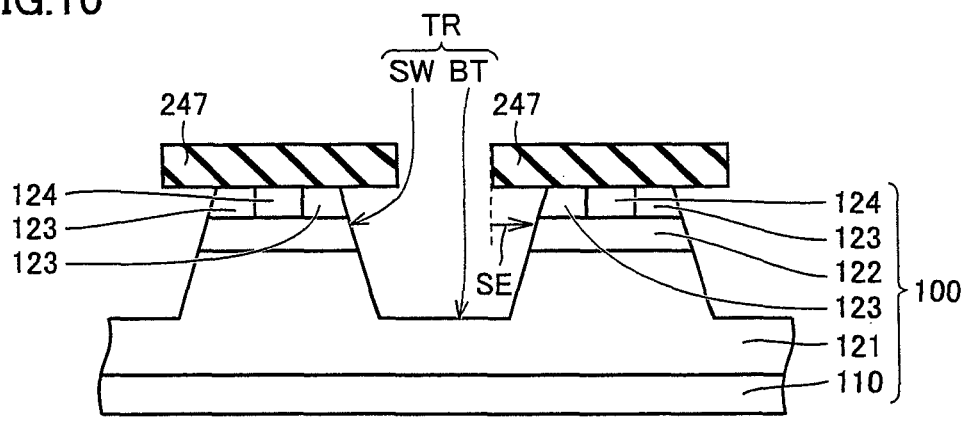
FIG. 10 is a partial cross sectional view schematically showing a sixth step of the method for manufacturing the silicon carbide semiconductor device of FIG. 1.

As a result of the thermal etching, trench TR is formed in epitaxial substrate 100 as shown in FIG. 10. During the formation of trench TR, epitaxial substrate 100 is side-etched from the opening of mask 247 as indicated by an arrow SE. Further, during this thermal etching, a special plane is spontaneously formed on side wall SW of trench TR, in particular, on the portion formed of p type body layer 122.

It should be noted that the reactive gas may contain a carrier gas in addition to the chlorine gas and the oxygen gas. An exemplary, usable carrier gas is nitrogen ($N_2$) gas, argon gas, helium gas, or the like. When the heat treatment temperature is set at not less than 700° C. and not more than 1000° C. as described above, a rate of etching SiC is approximately, for example, 70 µm/hour. In addition, in this case, mask 247, which is formed of silicon oxide and therefore has a very large selection ratio relative to SiC, is not substantially etched during the etching of SiC.

Figure 11:
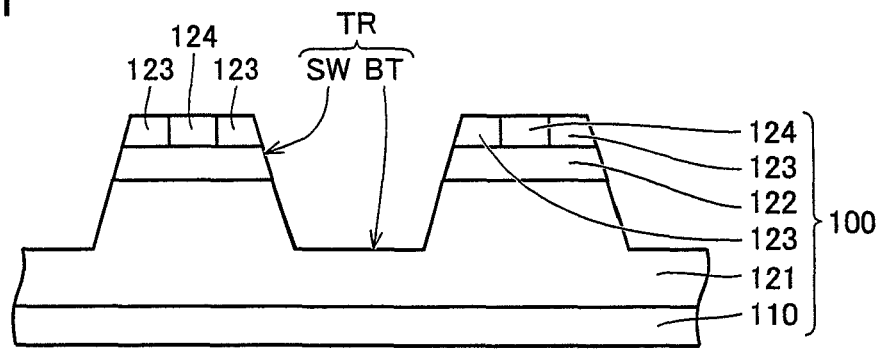
FIG. 11 is a partial cross sectional view schematically showing a seventh step of the method for manufacturing the silicon carbide semiconductor device of FIG. 1.

Next, mask 247 is removed (FIG. 11). This removal can be performed by wet etching, for example.

Figure 12:
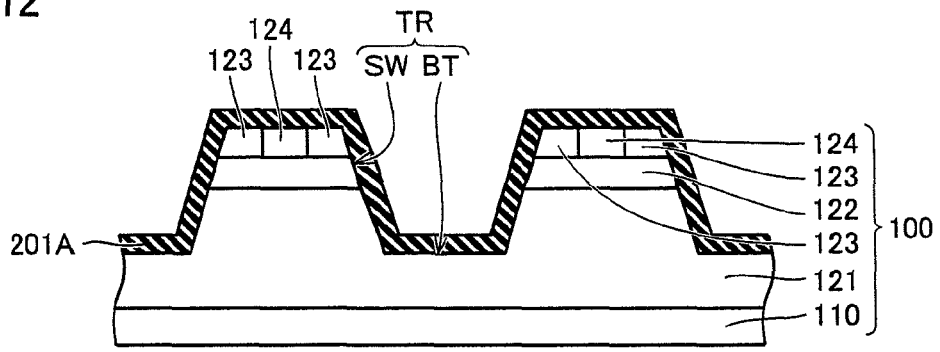
FIG. 12 is a partial cross sectional view schematically showing an eighth step of the method for manufacturing the silicon carbide semiconductor device of FIG. 1.

As shown in FIG. 12, trench insulating film 201A is formed by thermal oxidation of epitaxial substrate 100 so as to cover each of bottom portion BT and side wall SW of trench TR. Specifically, epitaxial substrate 100 is heated in an oxidizing atmosphere up to a temperature of, for example, not less than approximately 1300° C. and not more than approximately 1400° C.

Figure 13:
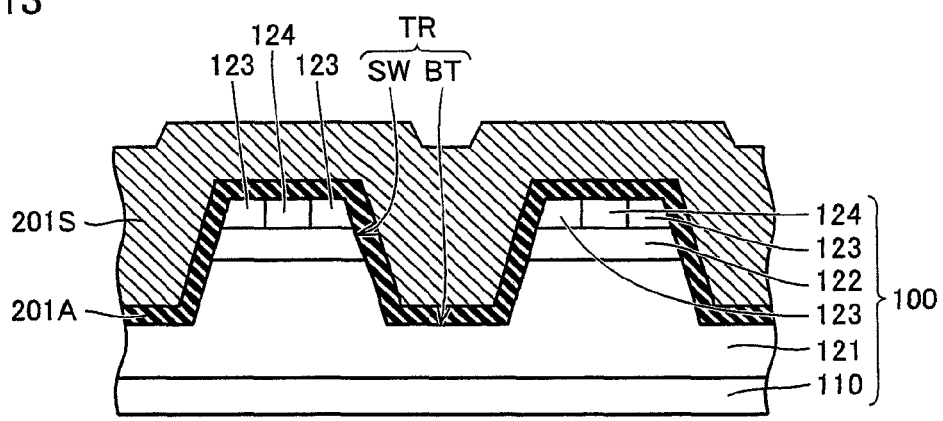
FIG. 13 is a partial cross sectional view schematically showing a ninth step of the method for manufacturing the silicon carbide semiconductor device of FIG. 1.

As shown in FIG. 13, silicon film 201S is formed to fill trench TR with trench insulating film 201A interposed therebetween. This formation can be performed using, for example, an atmospheric pressure CVD method.

Figure 14:
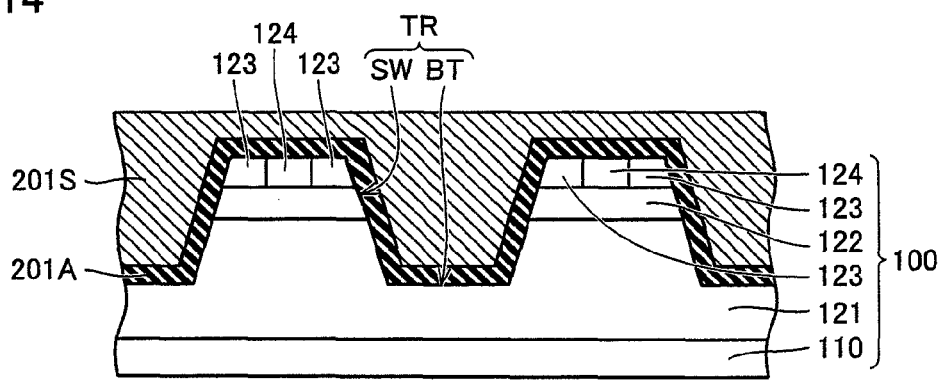
FIG. 14 is a partial cross sectional view schematically showing a tenth step of the method for manufacturing the silicon carbide semiconductor device of FIG. 1.

As shown in FIG. 14, silicon film 201S is flattened. Preferably, silicon film 201S is flattened by means of CMP (Chemical Mechanical Polishing).

Figure 15:
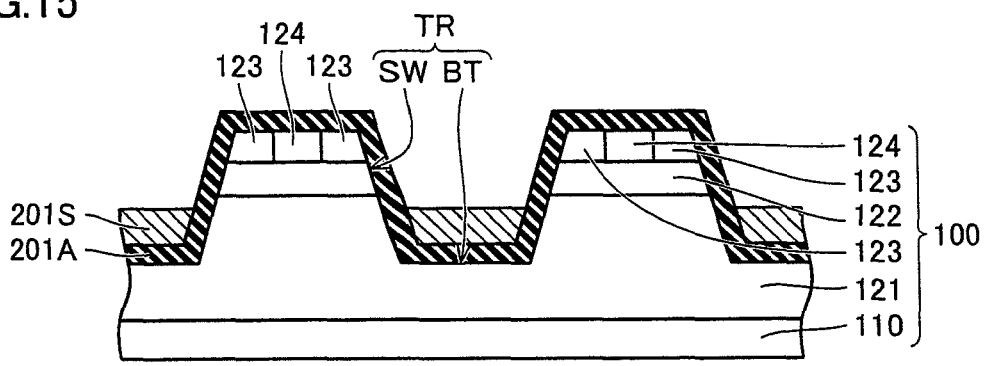
FIG. 15 is a partial cross sectional view schematically showing an eleventh step of the method for manufacturing the silicon carbide semiconductor device of FIG. 1.

As shown in FIG. 15, silicon film 201S is partially etched so as to expose a portion of trench insulating film 201A that covers p type body layer 122 on side wall SW, and so as to leave a portion of silicon film 201S that is disposed on bottom portion BT with trench insulating film 201A being interposed therebetween. In other words, silicon film 201S is etched back to a location deeper than p type body layer 122. Silicon film 201S is preferably partially etched to have a thickness of less than 300 nm.

During the partial etching of silicon film 201S, etching having a physical etching effect is performed. Examples of the etching having the physical etching effect includes: RIE as dry etching having a physical effect in addition to a chemical etching effect; and IBE (Ion Beam Etching) having a physical etching effect. As a gas for the dry etching, a gas containing sulfur hexafluoride ($SF_6$) can be used, for example.

Figure 16:
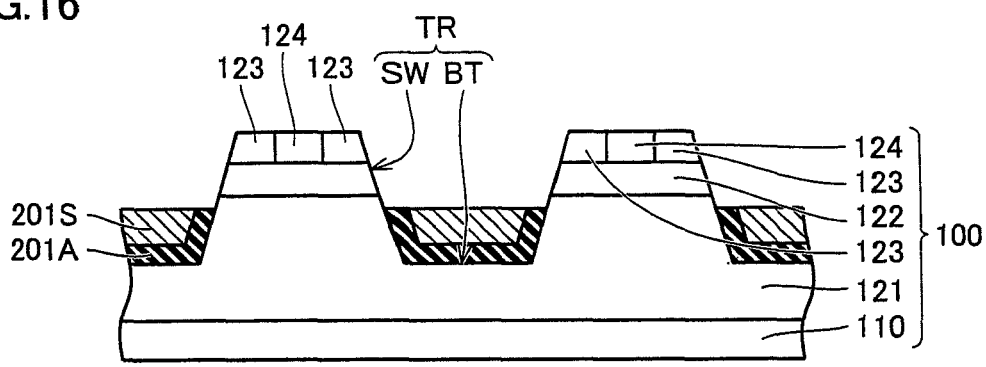
FIG. 16 is a partial cross sectional view schematically showing a twelfth step of the method for manufacturing the silicon carbide semiconductor device of FIG. 1.

Next, the exposed portion of trench insulating film 201A is removed by etching (FIG. 16). This removes the portion of trench insulating film 201A that covers p type body layer 122 on side wall SW. As a result, p type body layer 122 is exposed on side wall SW. For this etching, wet etching is preferable. For example, the etching is performed using HF. After the etching, RCA cleaning is preferably performed.

Figure 17:
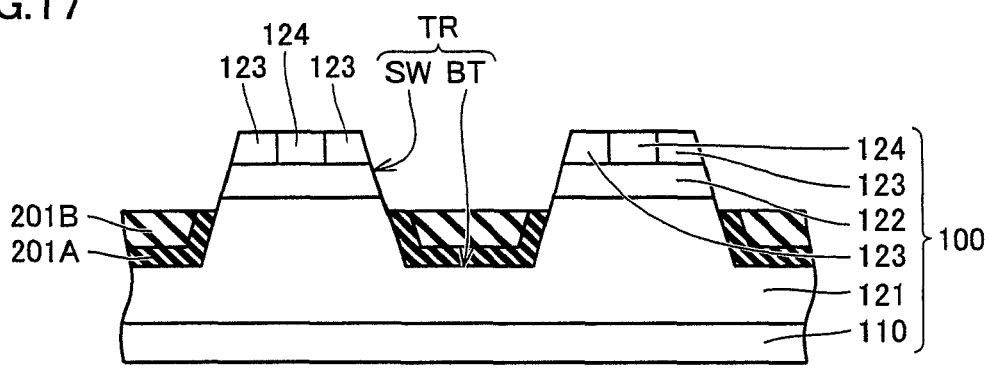
FIG. 17 is a partial cross sectional view schematically showing a thirteenth step of the method for manufacturing the silicon carbide semiconductor device of FIG. 1.

Next, bottom insulating film 201B is formed by oxidizing silicon film 201S (FIG. 17). During the formation of bottom insulating film 201B, silicon film 201S is preferably completely oxidized by thermally oxidizing silicon at not less than 900° C. and not more than 1100° C.

Figure 18:
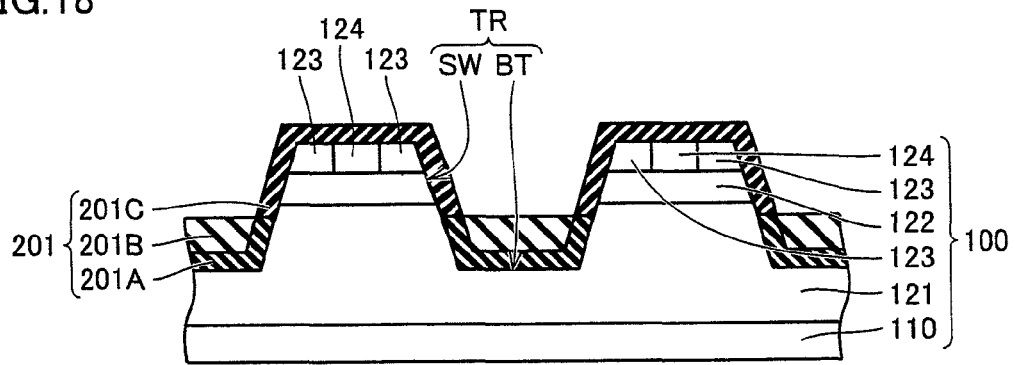
FIG. 18 is a partial cross sectional view schematically showing a fourteenth step of the method for manufacturing the silicon carbide semiconductor device of FIG. 1.

As shown in FIG. 18, side wall insulating film 201C is formed by thermal oxidation so as to cover p type body layer 122 on side wall SW. Specifically, in order to thermally oxidize epitaxial substrate 100, epitaxial substrate 100 is heated in an oxidizing atmosphere up to a temperature of, for example, not less than approximately 1300° C. and not more than approximately 1400° C. Preferably, oxygen is supplied to epitaxial substrate 100 while increasing the temperature of epitaxial substrate 100 during the heating of epitaxial substrate 100.

Figure 19:
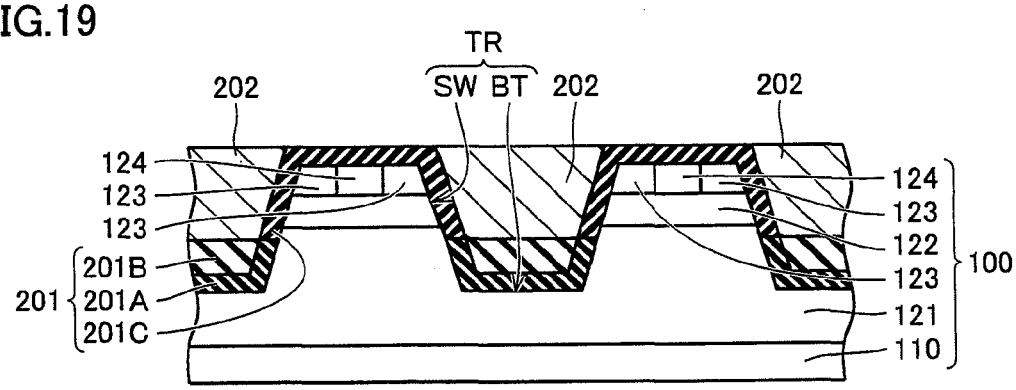
FIG. 19 is a partial cross sectional view schematically showing a fifteenth step of the method for manufacturing the silicon carbide semiconductor device of FIG. 1.

As shown in FIG. 19, gate electrode 202 is formed on side wall SW with side wall insulating film 201C being interposed therebetween. Gate electrode 202 is formed in direct contact with side wall insulating film 201C on p type body layer 122. Gate electrode 202 can be formed by, for example, forming a film of conductor or doped polysilicon and performing CMP.

Figure 20:
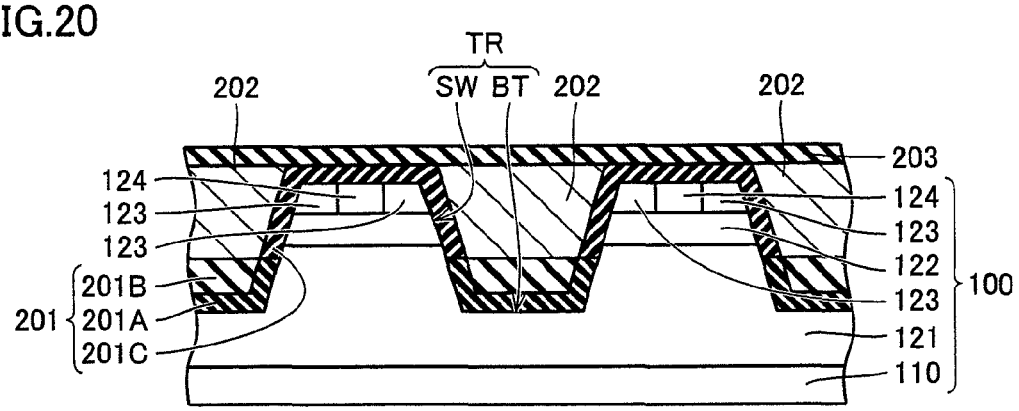
FIG. 20 is a partial cross sectional view schematically showing a sixteenth step of the method for manufacturing the silicon carbide semiconductor device of FIG. 1.
Figure 21:
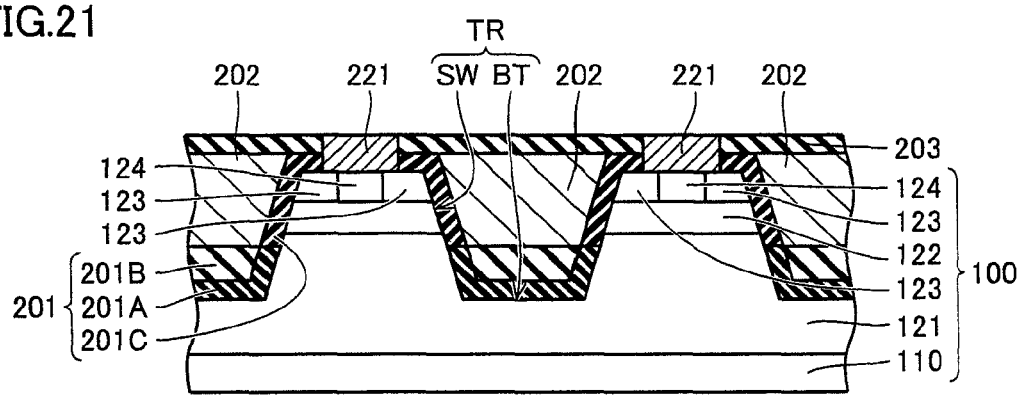
FIG. 21 is a partial cross sectional view schematically showing a seventeenth step of the method for manufacturing the silicon carbide semiconductor device of FIG. 1.

As shown in FIG. 20, interlayer insulating film 203 is formed on gate electrode 202 and gate insulating film 201 so as to cover the exposed surface of gate electrode 202. Referring to FIG. 21, etching is performed to form openings in interlayer insulating film 203 and gate insulating film 201. Through the openings, each of n region 123 and contact region 124 is exposed on the upper surface of the mesa structure. Next, on the upper surface of the mesa structure, source electrode 221 is formed in contact with each of n region 123 and contact region 124. Referring to FIG. 1 again, source interconnection 222, drain electrode 211, and protecting electrode 212 are formed. In this way, MOSFET 500 is obtained.

According to the present embodiment, as shown in FIG. 4, electric insulation between gate electrode 202 and bottom portion BT of trench TR is improved by bottom insulating film 201B. Accordingly, MOSFET 500 has a large breakdown voltage without increasing the threshold voltage. Further, side wall insulating film 201C covering p type body layer 122 on side wall SW, i.e., the portion of gate insulating film 201 covering channel surface CH (FIG. 3) is formed after the etching of silicon film 201S (FIG. 15). Hence, the portion of gate insulating film 201 that covers channel surface CH is not damaged by the etching. In this way, reliability of MOSFET 500 is improved.

Further, side wall insulating film 201C is formed by the thermal oxidation (FIG. 18). Accordingly, thin and highly smooth side wall insulating film 201C can be obtained. In this way, reliability of MOSFET 500 is further improved. Further, trench insulating film 201A is formed by the thermal oxidation (FIG. 12). Hence, trench insulating film 201A can be readily formed.

During the partial etching of silicon film 201S (FIG. 15), etching having a physical etching effect is performed. The side wall insulating film (FIG. 18), which is to be formed after this etching, is not directly damaged by the physical etching. In this way, reliability of MOSFET 500 is further improved.

During this etching, side wall SW is covered with trench insulating film 201A (FIG. 15). Accordingly, side wall SW of epitaxial substrate 100 is protected against the etching having the physical effect. This leads to improved quality of side wall insulating film 201C, which is to be subsequently formed by thermally oxidizing side wall SW.

Trench insulating film 201A, which is damaged by this etching and disposed on side wall SW (the exposed portion of trench insulating film 201A in FIG. 15), is removed before forming gate electrode 202 (FIG. 16). In this way, the damaged film can be removed from gate insulating film 201 (FIG. 1). In this way, overall quality of gate insulating film 201 can be improved.

Further, silicon film 201S is flattened before partially etching silicon film 201S (i.e., before the step in FIG. 15) (FIG. 14). Accordingly, during the partial etching of silicon film 201S, the portion of trench insulating film 201A that covers p type body layer 122 on side wall SW is readily exposed and the portion of silicon film 201S disposed on bottom portion BT with trench insulating film 201A being interposed therebetween is readily left.

During the partial etching of silicon film 201S (FIG. 15), dry etching is performed using a gas containing $SF_6$. Accordingly, etching selectivity of silicon relative to silicon oxide can be sufficiently improved. Accordingly, silicon film 201S can be quickly etched while suppressing trench insulating film 201A from being etched. If this selectivity is too high, surface roughness is likely to be obtained during the etching because a small residue of silicon oxide provides a large masking effect. This selectivity is not too high in the case where $SF_6$ is employed. Hence, surface roughness can be suppressed during the etching.

Further, silicon film 201S is preferably partially etched to have a thickness of less than 300 nm (FIG. 15). Accordingly, a whole of silicon film 201S can be readily oxidized in the formation of bottom insulating film 201B (FIG. 17).

During the formation of bottom insulating film 201B (FIG. 17), silicon film 201S (FIG. 16) may be completely oxidized by thermally oxidizing silicon at not less than 900° C. and not more than 1100° C. With the temperature of not less than 900° C., the thermal oxidation can be performed at a practical rate. With the temperature of not more than 1100° C., SiO gas can be suppressed from being generated due to reaction between Si in silicon film 201S and $SiO_2$ in trench insulating film 201A. Accordingly, contamination by $SiO_2$ particles, which are otherwise generated due to oxidation of the SiO gas, can be suppressed.

Meanwhile, oxygen may be supplied to epitaxial substrate 100 while increasing temperature of epitaxial substrate 100 during the heating of epitaxial substrate 100 for the thermal oxidation to form side wall insulating film 201C (FIG. 18). The oxygen thus supplied reacts with Si of silicon film 201S to form $SiO_2$. Accordingly, SiO gas can be suppressed from being generated due to reaction between Si in silicon film 201S and $SiO_2$ in trench insulating film 201A. Accordingly, contamination by $SiO_2$ particles, which are otherwise generated due to oxidation of the SiO gas, can be suppressed. In the case where oxygen is thus supplied while increasing the temperature, SiO gas can be suppressed from being generated even when the temperature of epitaxial substrate 100 is made higher than 1100° C. before the whole of silicon film 201S (FIG. 16) is thermally oxidized. Accordingly, the increase of the temperature can be attained at a high rate while suppressing the particle contamination. Accordingly, it takes a short time to simultaneously form bottom insulating film 201B and side wall insulating film 201C.

It should be noted that in the present embodiment, the "first conductivity type" is n type, and the "second conductivity type" is p type, but these conductivity types may be replaced with each other. In this case, the donor and the acceptor in the above description are also replaced with each other. It should be noted that in order to attain higher channel mobility, the "first conductivity type" is preferably n type. Further, the silicon carbide semiconductor device is not limited to the MOSFET, and may be, for example, a trench type IGBT (Insulated Gate Bipolar Transistor).

Second Embodiment

Figure 22:
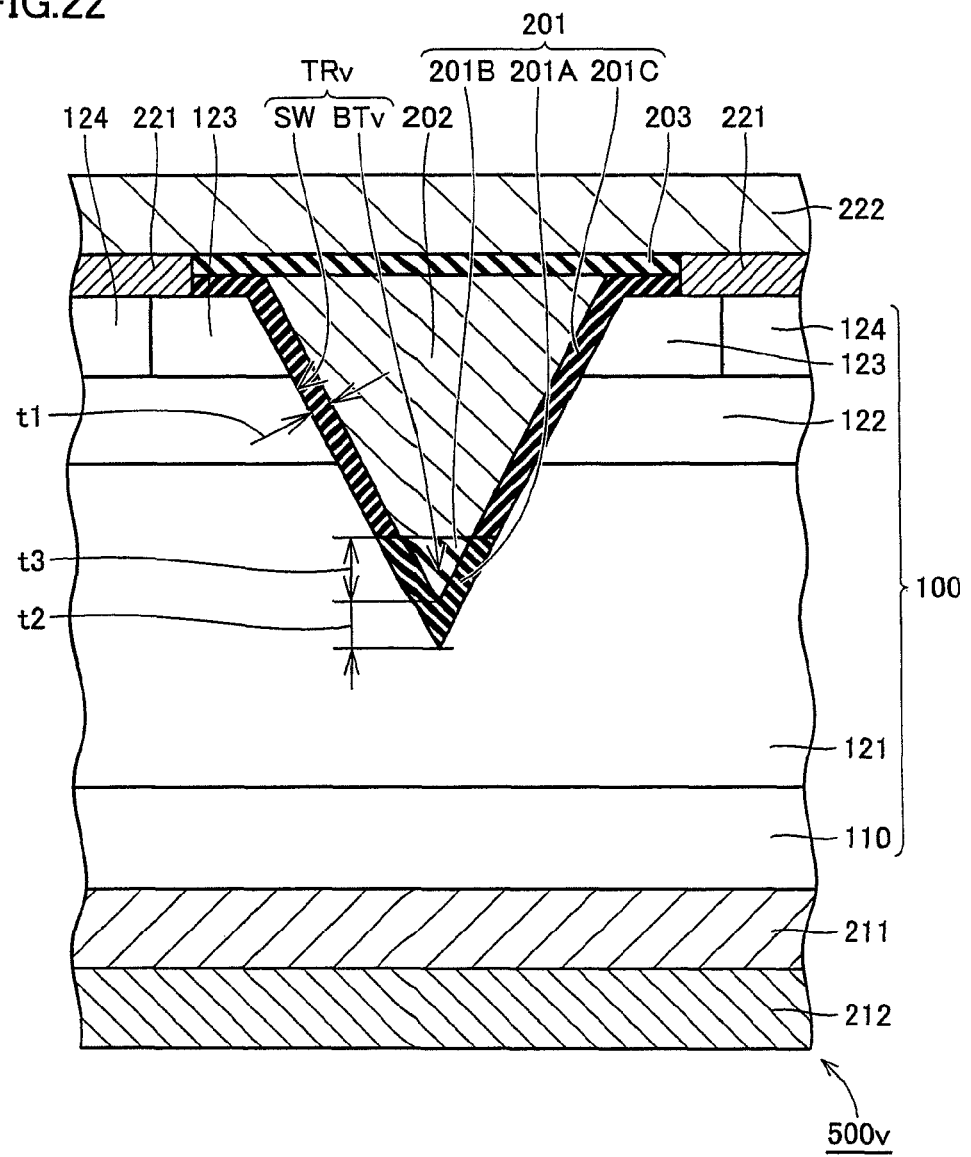
FIG. 22 is a partial cross sectional view schematically showing a configuration of a silicon carbide semiconductor device in a second embodiment of the present invention.

As shown in FIG. 22, a MOSFET 500v (silicon carbide semiconductor device) of the present embodiment has a V-shaped trench TRv instead of trench TR (FIG. 4). Trench TRv has a bottom portion BTv instead of bottom portion BT (FIG. 4). When viewed in cross section (FIG. 22), bottom portion BTv is a portion at which side walls SW opposite to each other are in contact with each other to form the V shape. It should be noted that configurations other than the above are substantially the same as those of the first embodiment. Hence, the same or corresponding elements are given the same reference characters and are not described repeatedly.

(Surface Having Special Plane)

Figure 23:
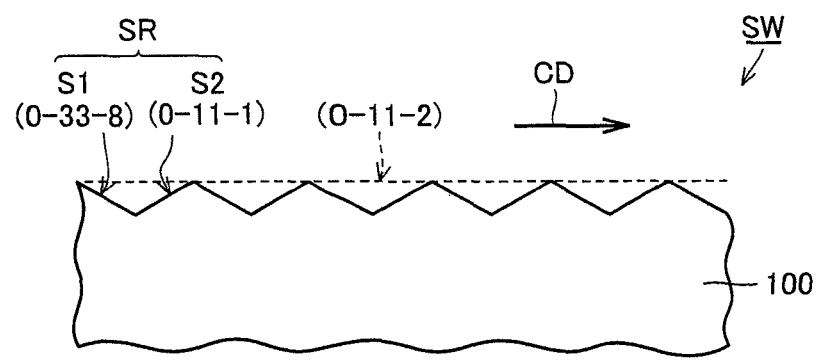
FIG. 23 is a partial cross sectional view schematically showing a fine structure in a surface of a silicon carbide substrate included in the silicon carbide semiconductor device.

As described above, side wall SW (FIG. 1) of trench TR preferably has a predetermined crystal plane (also referred to as "special plane") particularly on p type body layer 122. Such a side wall SW includes a plane S1 (first plane) having a plane orientation of {0-33-8} as shown in FIG. 23. Preferably, plane S1 has a plane orientation of (0-33-8).

More preferably, side wall SW microscopically includes plane S1, and side wall SW microscopically further includes a plane S2 (second plane) having a plane orientation of {0-11-1}. Here, the term "microscopically" refers to "minutely to such an extent that at least the size about twice as large as an interatomic spacing is considered". As a method for observing such a microscopic structure, for example, a TEM (Transmission Electron Microscope) can be used. Preferably, plane S2 has a plane orientation of (0-11-1).

Preferably, plane S1 and plane S2 of side wall SW form a combined plane SR having a plane orientation of {0-11-2}. Combined plane SR is formed of periodically repeated planes S1 and S2. Such a periodic structure can be observed by, for example, TEM or AFM (Atomic Force Microscopy). In this case, combined plane SR has an off angle of 62° relative to the {000-1} plane, macroscopically. Here, the term "macroscopically" refers to "disregarding a fine structure having a size of approximately interatomic spacing". For the measurement of such a macroscopic off angle, a method employing general X-ray diffraction can be used, for example. Preferably, combined plane SR has a plane orientation of (0-11-2). In this case, combined plane SR has an off angle of 62° relative to the (000-1) plane, macroscopically.

Preferably, in the channel surface, carriers flow in a channel direction CD, in which the above-described periodic repetition is done.

The following describes detailed structure of combined plane SR.

Figure 24:
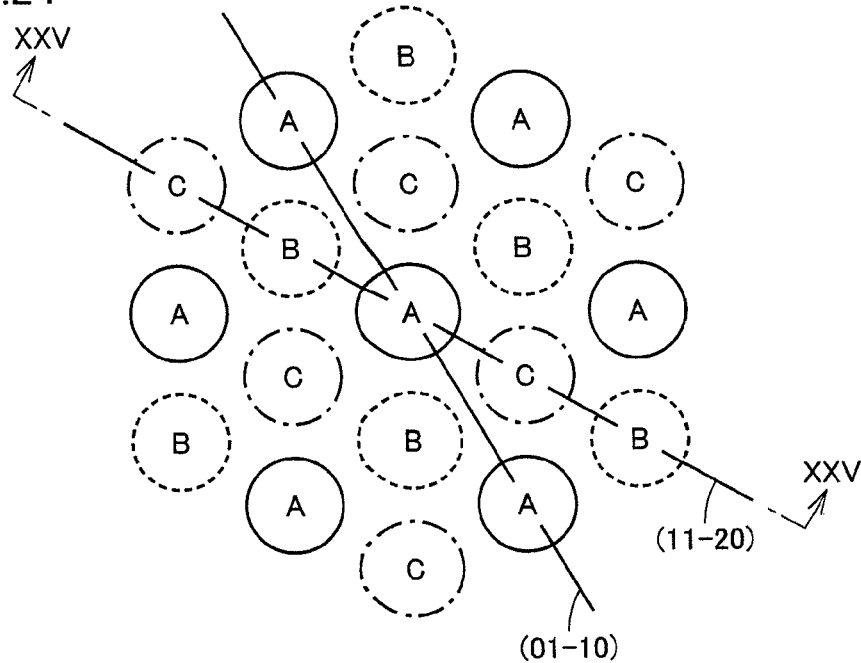
FIG. 24 shows a crystal structure of a (000-1) plane in a hexagonal crystal of polytype 4H.

Generally, regarding Si atoms (or C atoms), when viewing a silicon carbide single crystal of polytype 4H from the (000-1) plane, atoms in a layer A (solid line in the figure), atoms in a layer B (broken line in the figure) disposed therebelow, and atoms in a layer C (chain line in the figure) disposed therebelow, and atoms in a layer B (not shown in the figure) disposed therebelow are repeatedly provided as shown in FIG. 24. In other words, with four layers ABCB being regarded as one period, a periodic stacking structure such as ABCBAB-CBABCB . . . is provided.

Figure 25:
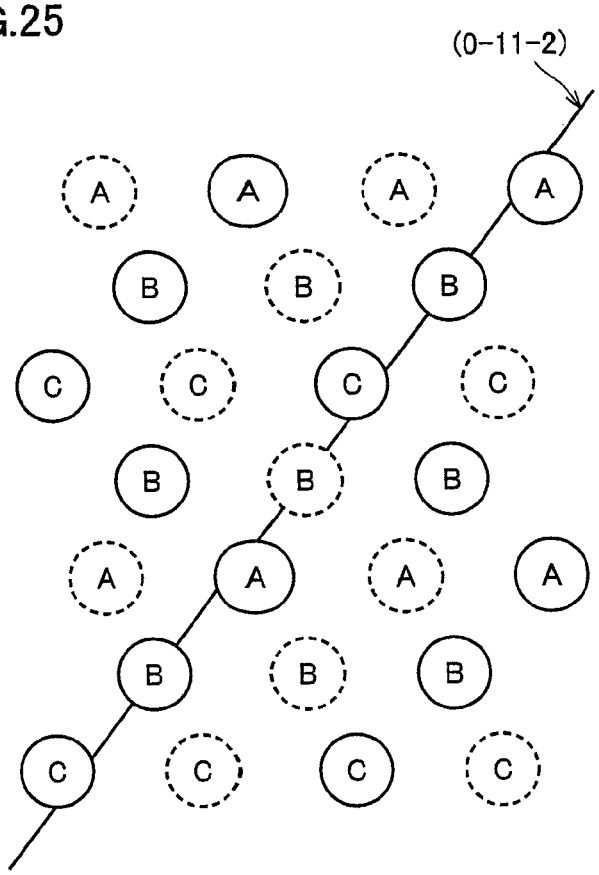
FIG. 25 shows a crystal structure of a (11-20) plane along a line XXV-XXV in FIG. 24.

As shown in FIG. 25, in the (11-20) plane (cross section taken along a line XXV-XXV of FIG. 24), atoms in each of four layers ABCB constituting the above-described one period are not aligned completely along the (0-11-2) plane. In FIG. 25, the (0-11-2) plane is illustrated to pass through the locations of the atoms in layers B. In this case, it is understood that each of atoms in layers A and C is deviated from the (0-11-2) plane. Hence, even when the macroscopic plane orientation of the surface of the silicon carbide single crystal, i.e., the plane orientation thereof with its atomic level structure being disregarded is limited to (0-11-2), this surface can have various structures microscopically.

Figure 26:
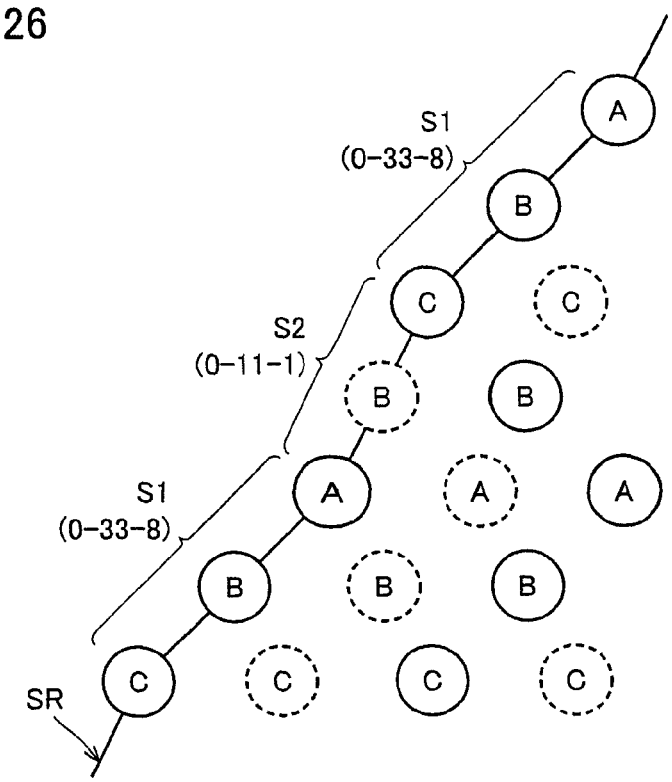
FIG. 26 shows a crystal structure of a combined plane of FIG. 23 in the vicinity of the surface within the (11-20) plane.

As shown in FIG. 26, combined plane SR is constructed by alternately providing planes S1 having a plane orientation of (0-33-8) and planes S2 connected to planes S1 and having a plane orientation different from that of each of planes S1. Each of planes S1 and S2 has a length twice as large as the interatomic spacing of the Si atoms (or C atoms). It should be noted that a plane with plane S1 and plane S2 being averaged corresponds to the (0-11-2) plane (FIG. 25).

Figure 27:
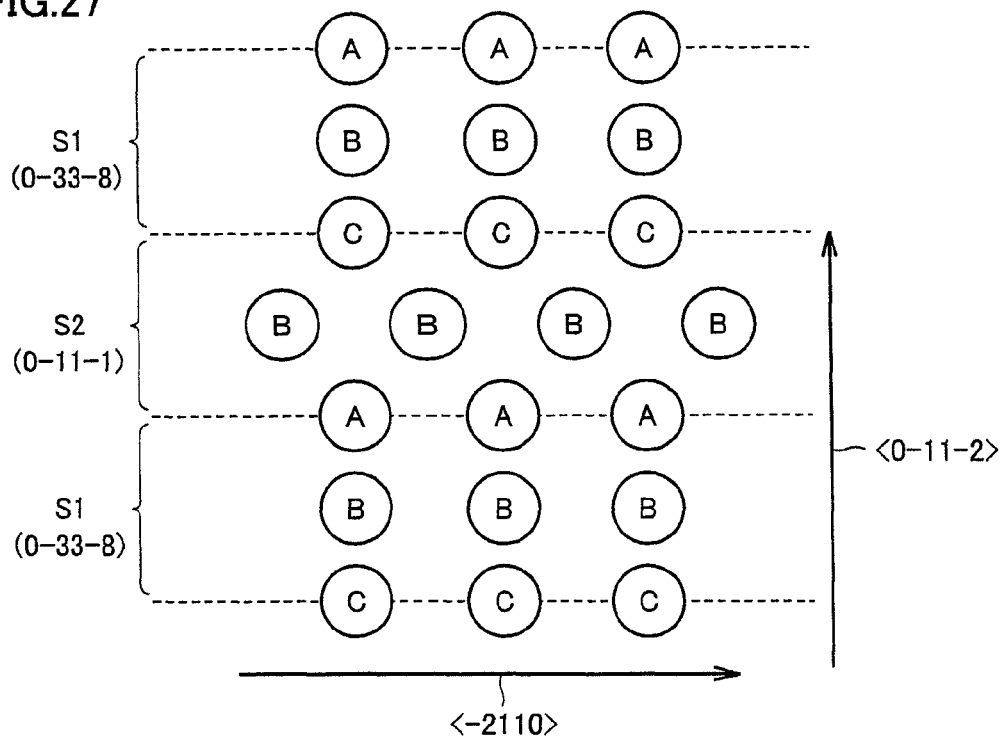
FIG. 27 shows the combined plane of FIG. 23 when viewed from a (01-10) plane.

As shown in FIG. 27, when viewing combined plane SR from the (01-10) plane, the single-crystal structure has a portion periodically including a structure (plane S1 portion) equivalent to a cubic structure. Specifically, combined plane SR is constructed by alternately providing planes S1 having a plane orientation of (001) in the above-described structure equivalent to the cubic structure and planes S2 connected to planes S1 and having a plane orientation different from that of each of planes S1. Also in a polytype other than 4H, the surface can be formed of the planes (planes S1 in FIG. 27) having a plane orientation of (001) in the structure equivalent to the cubic structure and the planes (planes S2 in FIG. 27) connected to the foregoing planes and having a plane orientation different from that of each of the foregoing planes. The polytype may be, for example, 6H or 15R.

Figure 28:
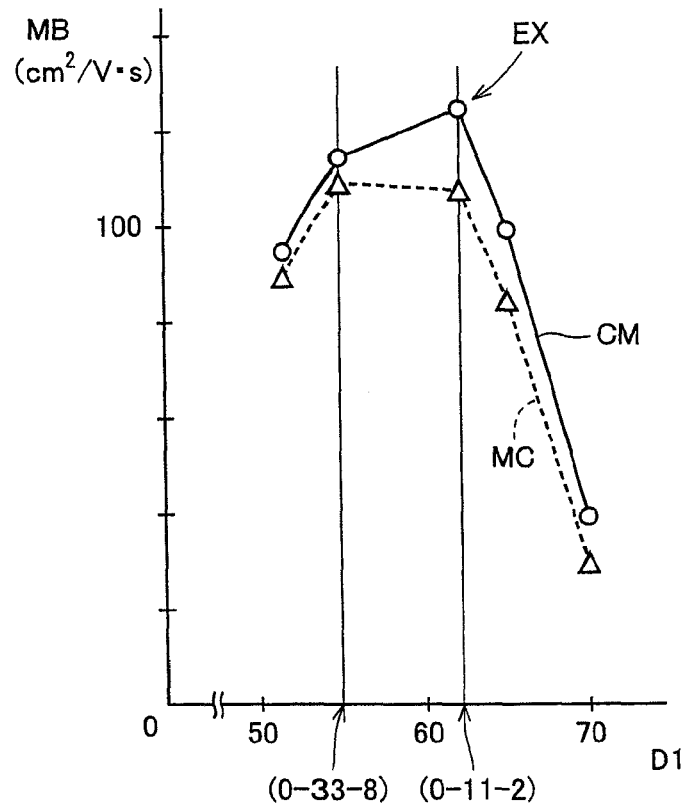
FIG. 28 is a graph showing an exemplary relation between channel mobility and an angle between a channel surface and the (000-1) plane when macroscopically viewed, in each of a case where thermal etching is performed and a case where no thermal etching is performed.

Referring to FIG. 28, the following describes a relation between the crystal plane of side wall SW and mobility MB of the channel surface. In the graph of FIG. 28, the horizontal axis represents an angle D1 formed by the (000-1) plane and the macroscopic plane orientation of side wall SW having the channel surface, whereas the vertical axis represents mobility MB. A group of plots CM correspond to a case where side wall SW is finished to correspond to a special plane by thermal etching, whereas a group of plots MC correspond to a case where side wall SW is not thermally etched.

In group of plots MC, mobility MB is at maximum when the surface of the channel surface has a macroscopic plane orientation of (0-33-8). This is presumably due to the following reason. That is, in the case where the thermal etching is not performed, i.e., in the case where the microscopic structure of the channel surface is not particularly controlled, the macroscopic plane orientation thereof corresponds to (0-33-8), with the result that a ratio of the microscopic plane orientation of (0-33-8), i.e., the plane orientation of (0-33-8) in consideration of that in atomic level becomes statistically high.

On the other hand, mobility MB in group of plots CM is at maximum when the macroscopic plane orientation of the surface of the channel surface is (0-11-2) (arrow EX). This is presumably due to the following reason. That is, as shown in FIG. 26 and FIG. 27, the multiplicity of planes S1 each having a plane orientation of (0-33-8) are densely and regularly arranged with planes S2 interposed therebetween, whereby a ratio of the microscopic plane orientation of (0-33-8) becomes high in the surface of the channel surface.

Figure 29:
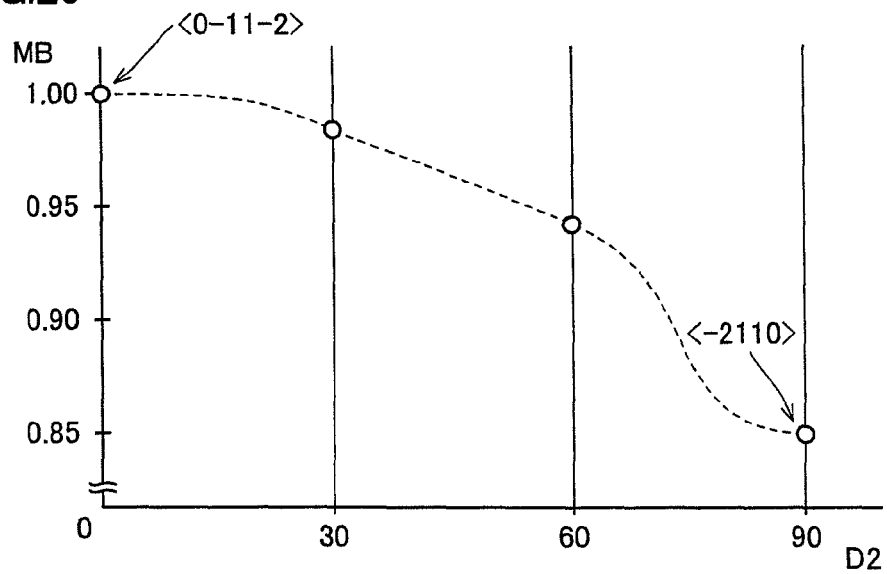
FIG. 29 is a graph showing an exemplary relation between the channel mobility and an angle between a channel direction and a <0-11-2> direction.

It should be noted that mobility MB has orientation dependency on combined plane SR. In a graph shown in FIG. 29, the horizontal axis represents an angle D2 between the channel direction and the <0-11-2> direction, whereas the vertical axis represents mobility MB (in any unit) in channel surface CH. A broken line is supplementarily provided therein for viewability of the graph. From this graph, it has been found that in order to increase channel mobility MB, channel direction CD (FIG. 23) preferably has an angle D2 of not less than 0° and not more than 60°, more preferably, substantially 0°.

Figure 30:
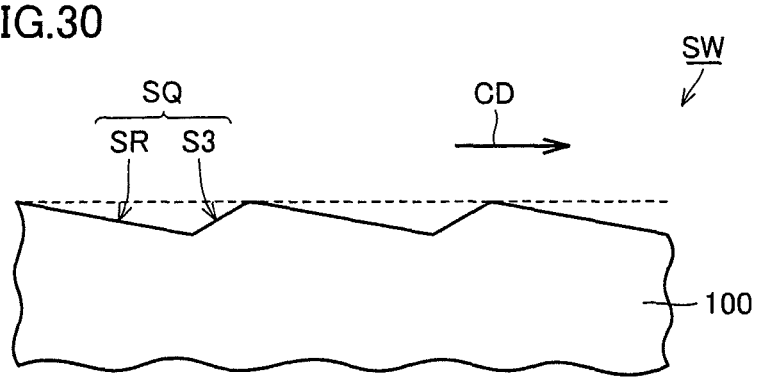
FIG. 30 shows a modification of FIG. 23.

As shown in FIG. 30, side wall SW may further include plane S3 (third plane) in addition to combined plane SR. More specifically, side wall SW may include a combined plane SQ formed of periodically repeated plane S3 and combined plane SR. In this case, the off angle of side wall SW relative to the {000-1} plane is deviated from the ideal off angle of combined plane SR, i.e., 62°. Preferably, this deviation is small, preferably, in a range of ±10°. Examples of a surface included in such an angle range include a surface having a macroscopic plane orientation of the {0-33-8} plane. More preferably, the off angle of side wall SW relative to the (000-1) plane is deviated from the ideal off angle of combined plane SR, i.e., 62°. Preferably, this deviation is small, preferably, in a range of ±10°. Examples of a surface included in such an angle range include a surface having a macroscopic plane orientation of the (0-33-8) plane.

Such a periodic structure can be observed by, for example, TEM or AFM.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method for manufacturing a silicon carbide semiconductor device comprising the steps of:
    preparing a silicon carbide substrate including a first layer that has first conductivity type, a second layer that is provided on said first layer and that has second conductivity type, and a third layer that is provided on said second layer, that is separated from said first layer by said second layer, and that has said first conductivity type;
    forming a trench in said silicon carbide substrate, said trench having a side wall and a bottom portion, said side wall extending through said third layer and said second layer and reaching said first layer, said bottom portion being formed of said first layer;
    forming a trench insulating film to cover each of said bottom portion and said side wall;
    forming a silicon film to fill said trench with said trench insulating film being interposed therebetween;

partially etching said silicon film so as to expose a portion of said trench insulating film that covers said second layer on said side wall and so as to leave a portion of said silicon film that is disposed on said bottom portion with said trench insulating film being interposed therebetween;

exposing said second layer on said side wall by removing the portion of said trench insulating film that covers said second layer on said side wall, after the step of partially etching said silicon film;

forming a bottom insulating film which contacts said trench insulating film covering said bottom portion of said trench by entirely converting said silicon film on said trench insulating film into an oxide film, after the step of exposing said second layer;

forming a side wall insulating film to cover said second layer on said side wall, after the step of exposing said second layer; and forming a gate electrode on said side wall with said side wall insulating film being interposed therebetween.

2. The method for manufacturing the silicon carbide semiconductor device according to claim 1, wherein the step of forming said side wall insulating film is performed by thermal oxidation.

3. The method for manufacturing the silicon carbide semiconductor device according to claim 1, wherein the step of forming said trench insulating film is performed by thermal oxidation.

4. The method for manufacturing the silicon carbide semiconductor device according to claim 1, wherein the step of partially etching said silicon film includes the step of performing etching having a physical etching effect.

5. The method for manufacturing the silicon carbide semiconductor device according to claim 1, further comprising the step of flattening said silicon film before the step of partially etching said silicon film.

6. The method for manufacturing the silicon carbide semiconductor device according to claim 1, wherein the step of forming said bottom insulating film includes the step of oxidizing said silicon film by thermally oxidizing silicon at not less than 900° C. and not more than 1100° C.

7. The method for manufacturing the silicon carbide semiconductor device according to claim 1, wherein the step of forming said side wall insulating film includes the step of heating said silicon carbide substrate so as to thermally oxidize said silicon carbide substrate, and the step of heating said silicon carbide substrate includes the step of supplying oxygen to said silicon carbide substrate while increasing a temperature of said silicon carbide substrate.

8. The method for manufacturing the silicon carbide semiconductor device according to claim 1, wherein the step of partially etching said silicon film includes the step of performing dry etching using a gas containing sulfur hexafluoride.

9. The method for manufacturing the silicon carbide semiconductor device according to claim 1, wherein the step of partially etching said silicon film is performed to provide said silicon film with a thickness of less than 300 nm.

10. The method for manufacturing the silicon carbide semiconductor device according to claim 1, wherein a thickness of the bottom insulating film is greater than a thickness of the trench insulating film.

11. The method for manufacturing the silicon carbide semiconductor device according to claim 1, wherein the step of forming said bottom insulating film includes converting said silicon film into said oxide film across an entire thickness of said silicon film.

12. The method for manufacturing the silicon carbide semiconductor device according to claim 1, wherein the step of forming said bottom insulating film includes the step of forming said bottom insulating film on said trench insulating film without leaving said silicon film between said trench insulating film and said bottom insulating film.

* * * * *